(12) United States Patent
Coors

(10) Patent No.: US 8,961,278 B2
(45) Date of Patent: Feb. 24, 2015

(54) SINGLE RACK COLD AIR CONTAINMENT

(75) Inventor: Lex Coors, Willemstad (NL)

(73) Assignee: Schneider Electric IT Corporation, West Kingston, RI (US)

( * ) Notice: Subject to any disclaimer, the term of this patent is extended or adjusted under 35 U.S.C. 154(b) by 705 days.

(21) Appl. No.: 12/856,533

(22) Filed: Aug. 13, 2010

(65) Prior Publication Data

US 2012/0037353 A1    Feb. 16, 2012

(51) Int. Cl.
G05D 23/00    (2006.01)
H05K 7/20    (2006.01)

(52) U.S. Cl.
CPC .................................. H05K 7/20745 (2013.01)
USPC ........................................... 454/184; 454/49

(58) Field of Classification Search
CPC .......... H05K 7/20745; H05K 7/20145; H05K 7/20736; H05K 7/20836
USPC .................................................... 454/49, 184
See application file for complete search history.

(56) References Cited

U.S. PATENT DOCUMENTS

| | | | |
|---|---|---|---|
| 4,261,519 A * | 4/1981 | Ester | 239/548 |
| 6,374,327 B2 | 4/2002 | Sakaki et al. | |
| 6,579,168 B1 * | 6/2003 | Webster et al. | 454/184 |
| 6,668,565 B1 * | 12/2003 | Johnson et al. | 62/89 |
| 6,672,955 B2 | 1/2004 | Charron | |
| 6,747,872 B1 * | 6/2004 | Patel et al. | 361/695 |
| 7,085,133 B2 * | 8/2006 | Hall | 361/695 |
| 7,144,320 B2 * | 12/2006 | Turek et al. | 454/184 |
| 7,295,444 B1 * | 11/2007 | Wang | 361/752 |
| 7,643,291 B2 * | 1/2010 | Mallia et al. | 361/695 |
| 7,841,199 B2 | 11/2010 | VanGilder et al. | |
| 7,903,407 B2 * | 3/2011 | Matsushima et al. | 361/695 |
| 8,141,621 B2 * | 3/2012 | Campbell et al. | 165/200 |
| 8,144,464 B2 * | 3/2012 | VanDerVeen et al. | 361/692 |
| 8,154,870 B1 * | 4/2012 | Czamara et al. | 361/694 |
| 8,233,274 B2 * | 7/2012 | Archibald et al. | 361/679.46 |
| 8,320,121 B2 * | 11/2012 | Bisson et al. | 361/679.51 |
| 8,730,671 B2 * | 5/2014 | VanDerVeen et al. | 361/692 |
| 2004/0100770 A1 * | 5/2004 | Chu et al. | 361/698 |
| 2007/0064389 A1 * | 3/2007 | Lewis et al. | 361/690 |
| 2007/0167125 A1 * | 7/2007 | Rasmussen et al. | 454/184 |
| 2008/0180908 A1 * | 7/2008 | Wexler | 361/690 |
| 2009/0061755 A1 * | 3/2009 | Calder et al. | 454/184 |

(Continued)

FOREIGN PATENT DOCUMENTS

EP    2059105 A1 *    5/2009    ............... H05K 7/20

OTHER PUBLICATIONS

International Search Report and Written Opinion for PCT/US2011/047772, mailed Mar. 28, 2012.

*Primary Examiner* — Kang Hu
*Assistant Examiner* — Anthony Kandare
(74) *Attorney, Agent, or Firm* — Hunter Clark PLLC

(57) ABSTRACT

A system for cooling rack mounted equipment includes: a rack configured to house rack mounted equipment, the rack providing a front port bordered by a top and two sides; and a cold-air duct separable from and attached to the rack about the top and two sides, the duct being configured to be in fluid communication with a region adjacent to the duct to receive air from the region, the duct includes: a front member; side members coupled to the front member; and an end member configured to selectively allow the passage of air through the end component from the region into the duct; where the duct is attached to the rack to form a substantially airtight seal between the rack and the duct.

18 Claims, 8 Drawing Sheets

(56) References Cited

U.S. PATENT DOCUMENTS

| | | | |
|---|---|---|---|
| 2009/0156114 A1* | 6/2009 | Ahladas et al. | 454/184 |
| 2010/0061057 A1* | 3/2010 | Dersch et al. | 361/690 |
| 2010/0151781 A1* | 6/2010 | Slessman et al. | 454/184 |
| 2010/0300650 A1* | 12/2010 | Bean, Jr. | 165/67 |
| 2011/0014862 A1* | 1/2011 | Honold et al. | 454/184 |
| 2012/0035781 A1* | 2/2012 | Archibald et al. | 700/300 |
| 2013/0040547 A1* | 2/2013 | Moore | 454/184 |
| 2013/0178144 A1* | 7/2013 | Archibald et al. | 454/184 |
| 2013/0295834 A1* | 11/2013 | Faist et al. | 454/184 |

* cited by examiner

SINGLE RACK COLD AIR CONTAINMENT

BACKGROUND

Communications and information technology equipment is commonly mounted in racks or enclosures. Equipment racks and enclosures are used to contain and to arrange communications and information technology equipment, such as servers, CPUs, networking equipment and storage devices in small wiring closets as well as equipment rooms and large data centers. A standard rack typically includes front-mounting rails to which multiple units of equipment, such as servers, are mounted and stacked vertically within the rack. A standard rack can be sparsely or densely populated with a variety of different components including components from different manufacturers.

Most rack-mounted communications and information technology equipment consumes electrical power and generates heat. The heat collectively generated in densely packed equipment racks can have adverse effects on the performance, reliability and useful life of the equipment in the racks. Accordingly, air cooling systems are often a part of an efficient data center, design. In particular, many air conditioning (e.g. cooling) systems, such as described in U.S. Pat. No. 6,374,627, include a raised floor to facilitate the system's air cooling and circulation functions. These systems typically use open floor tiles and floor grilles, perforated tiles, or vents to deliver cool air into the room of racks from the air passageway disposed below the raised floor of an equipment room. Perforated tiles are typically located in front of the equipment racks and enclosures. The cool air flows from below the raised floor to the front side of the equipment racks or enclosures.

As shown in FIGS. 1-2, rack-mounted equipment 101 is often cooled by air that flows along a front side or air inlet side of a rack, through the rack, and out the rear or exhaust side of the rack. Often, the rate of the airflow across the heat generating components within the rack is dependent on the size and speed of one or more fans located within the equipment. Consequently; the ability for the airflow to transfer heat away from the heat-sensitive components is heavily dependent on the inlet temperature of the air. In addition, the heat released from each, rack is released into the same environment which is being cooled, causing increased energy consumption due to mixed cool and hot air flows entering the racks.

Referring to FIGS. 3-4, to lower this energy consumption, a common configuration of equipment in a data center has the racks in rows 201, where the inlet sides of the rows are arranged face to face. Grilles or perforated tiles are located in the raised floor 215 between the two faces of the rows. This configuration, is commonly called a "cold aisle" because the cool air from the air cooling system flows into a cold air plenum 217 of the raised floor 215, through the perforated tiles and into an aisle 210 between the rows. The cool air is then drawn into the rack mounted equipment and exhausted to the space behind (typically a "hot aisle") or above the rows.

Placing racks into these cold aisle and hot aisle configurations provides a more efficient environment for the rack mounted equipment and codling equipment, such as computer room air conditioning (CRAC) unit. However, just creating the aisles is not sufficient to completely separate the mixture of the cold and hot air within a room. Recent developments have shown that further separation and containment of the cold aisles and hot aisles greatly improves efficiency and functionality of the rack mounted equipment and the CRAC units. Hot air from the hot aisles may be directed towards the inlet of the CRAC unit and the cold air release from the CRAC unit may be directed to the inlets of the rack mounted equipment. This may be done through doors 220 placed on the ends of the cold and hot aisles, along with ceilings and/or separators of various forms above the racks (not shown), which aid in containing the air within specific locations. For example, as shown in commonly owned U.S. patent application Ser. No. 11/131,503, filed May 17, 2005, entitled "COLD AISLE ISOLATION," baffles may be placed above or along the ends of the rows of racks:

Creating complete separation of cold and hot air is challenging, especially in areas of rack mounted equipment that may not be disconnected or re-located in the process. Referring again to FIG. 3, many of these areas include various sizes, shapes and numbers of racks, which do not follow the ideal configuration of equipment to form the aisles implementing the most efficient sealing techniques (i.e., doors). Often, stand alone 220 racks are located in the data center and the cold aisle containment does not provide a source of cold air for these racks. This occurs primarily in older data centers, which include large amounts of racks that accumulate over time out of necessity. Accordingly, as newer racks, rack systems and equipment are developed, variations in the data centers are inevitable, unless a completely new system is installed. Installation of an entire new system is extremely costly and, as previously mentioned, some rack mounted equipment may not be disconnected in the process.

SUMMARY

An example of a system for codling rack mounted equipment according to the disclosure includes: a rack configured to house rack mounted equipment, the rack providing a front port bordered by a top and two sides; and a cold-air duct separable from and attached to the rack about the top and two sides, the duet being configured to be in fluid communication with a region adjacent to the duct to receive air from the region, the duct including: a front member, a side members coupled to the front member j, and an end member configured to selectively allow the passage of air through the end component from the region into the duct; where the duct is attached to the rack to form a substantially airtight seal between the rack and the duct.

Embodiments of such a system may include one or more of the following features. The end member is a bottom member that includes louvers. The louvers are movable to adjust the amount of airflow within the structure. The end member is a top member including a panel configured to move in response to changes in pressure. The panel is configured to respond to a pressure inside the duct exceeding a threshold by opening to allow air to pass through the top member. The side members are attached to the rack by hook and loop fasteners. The system includes a temperature sensor and a controller communicatively coupled with the temperature sensor and the end member and configured, to control the end member in accordance with a temperature indicated by the temperature sensor to regulate air flow through the end member. The side members each have a width about one half a width of the front member. The system includes a cold air delivery mechanism configured to deliver cold air via the region to the duet.

An example of a duct for a rack having rack mounted equipment according to the disclosure includes: a front member; side members, where the two or more side members are coupled to the front member; an end member having one or more louvers configured to selectively allow the passage of air through the end member, and one or more actuators coupled to the end member and responsive to signals received from a controller, the signals causing the actuators to adjust the louvers of the end member; where the duct is separable from and attachable to the rack about the top and side members to form a substantially airtight seal between the rack and the duct; and where the duct is configured to be in fluid communication with a region adjacent to the rack and to receive air from the region.

Embodiments of such a duct may include one or more of the following features. The end panel is 30 centimeters in depth. The end panel is 60 centimeters in width. The one or more actuators and controller include a single unit. The side members are attached to the rack by hook and loop fasteners. The duct further including a top member, where the top member includes a panel configured to move in response to changes in pressure. The panel is configured to respond to a pressure inside the duct exceeding a threshold by opening to allow air to pass through the top member. The duct further including each of one or more temperature sensors, and one or more pressure sensors, where the sensors are communicatively coupled to the controller. The temperature and pressure indicated by the sensors determine the amount of adjustment by the actuators.

An example of a method for cooling rack mounted equipment includes: attaching a duct onto a rack configured to house the rack mounted equipment, the duct including: a front member; side members coupled to the front member; and an end member having one or more louvers, where the one or more louvers are configured to selectively allow the passage of air through the end member; supplying cold air into a duct, where the air is supplied vertically across the front of the rack; substantially containing the cold air within an area between the rack and the duct; measuring the temperature and the pressure within the contained area; and adjusting airflow into the contained area of the rack dependent on the measured temperature and pressure within the contained area.

Items and/or techniques of the disclosure may provide one or more of the following capabilities. For example, the duct advantageously allows for cold air containment on pre-existing configurations of data centers. The duct, which may also be referred to as a cold pipe in some embodiments, may be affixed to singular racks of various sizes accommodating different server sizes. In addition, the duct can offer a more cost effective approach. For instance, installing a hot or cold aisle containment system may not be cost efficient for a smaller data center, which only contains a few racks, or for singular racks of mounted equipment.

While duct configurations have been described, it may be possible for cold air containment to be achieved by means other than those noted, and various duct configurations may not necessarily yield the noted effect.

These and other capabilities of the invention, along with the invention itself, will be more fully understood after a review of the following figures, detailed description, and claims.

DETAILED DESCRIPTION

Techniques are described herein that provide/for a cold pipe system which inhibits rack mounted equipment from receiving hot air flow in a closed environment. An exemplary environment may include a data center, having a CRAC, a raised floor with a cold air plenum and vented tiles which deliver cold air to designated areas of the data center. The data center may contain cold and/of hot aisle containment systems along with additional racks located separate from the contained aisles and on which a cold pipe is attached. Cold air from the cold dr plenum is directed, vertically across the front of the rack mounted equipment and is contained within the cold pipe structure. The cold air enters through a louvered base of the cold pipe and exits through the rear of the rack, with any additional air being expelled through a louvered roof of the cold pipe structure. Other embodiments are within the scope of the invention, some of which are noted in the following paragraphs.

Figure 1:
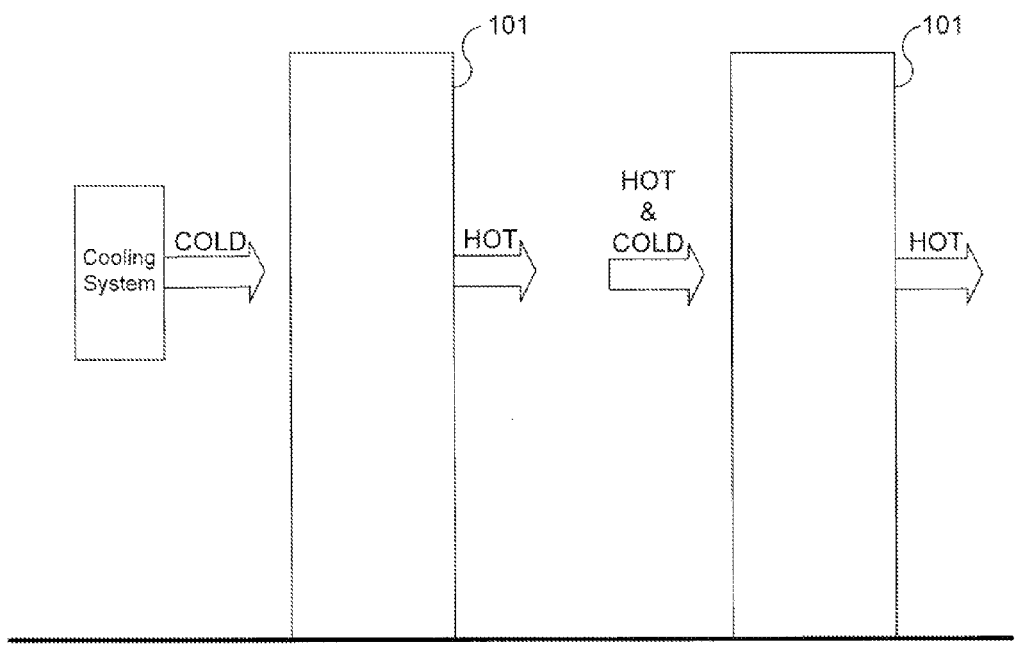
FIG. 1 is a simplified view of rack mounted equipment and associated airflow.
Figure 2:
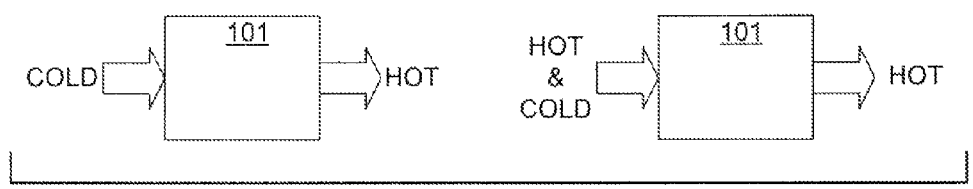
FIG. 2 is a simplified view of the associated airflow in the rack mounted equipment of FIG. 1.
Figure 3:
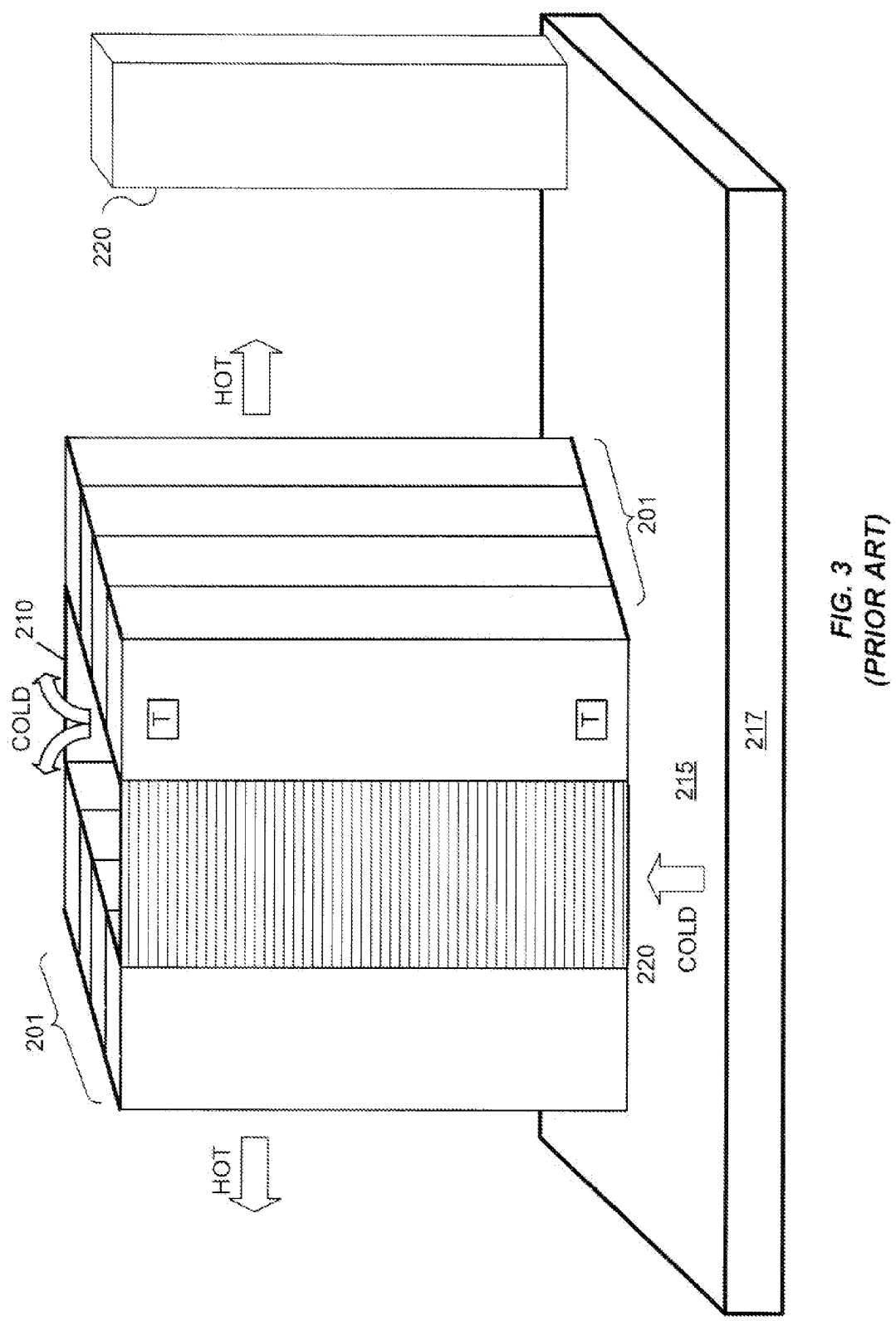
FIG. 3 is a simplified view of a data center.
Figure 4:
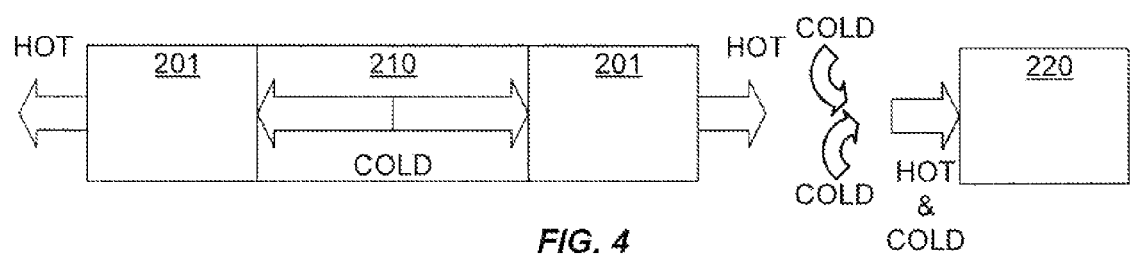
FIG. 4 is a simplified view of the associated airflow for the data center shown in FIG. 3.
Figure 5:
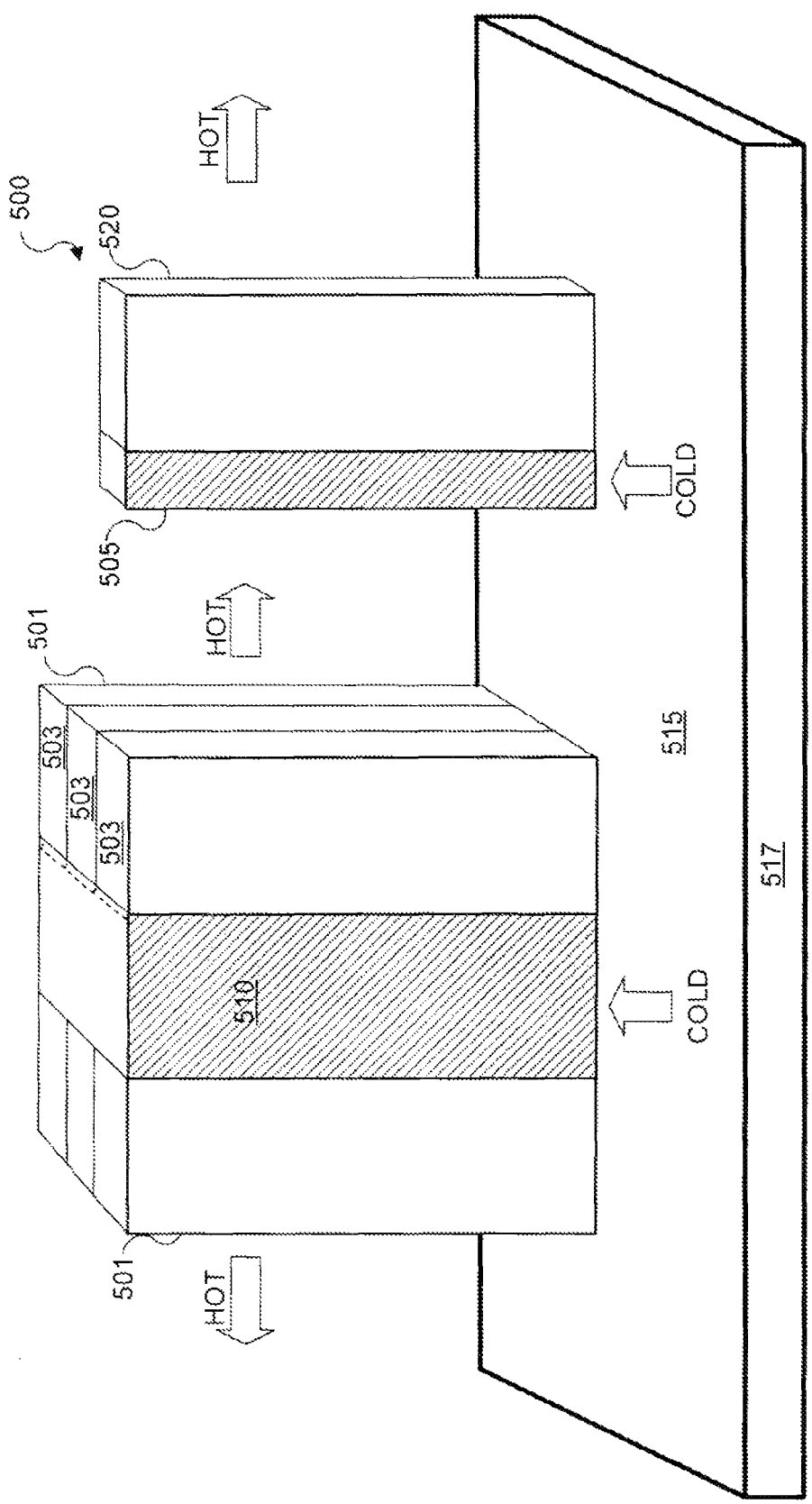
FIG. 5 is a simplified view of a data center with a cold pipe system.

Referring to FIG. 5, an exemplary data center environment implementing cold aisle containment and with an extraneous rack is provided. The data center is similar to the data center of FIG. 4, however a cold pipe system 500 is implemented on the extraneous rack 500. The data center includes rows 501 of racks 503, aligned to have the front of the racks facing each other, creating an aisle where cold air from the cold air plenum 517 of a raised tile floor 515 is supplied. The hot air leaving the rows 501, is released into the data center and may be directed through an air return system to the data center cooling system, such as a CRAC, which will aid in the overall efficiency of the data center. The individual rack 520 is located within the same data center, but away from the racks 503 within the cold aisle containment system. The individual rack 520 includes a cold pipe 505 attached to the front, where cold air from the same cold air plenum 517 as the cold aisle is also supplied. Hot air released from the individual rack 520 may similarly be directed to the cooling system by a vent, duct or other means. Accordingly, the cold pipe system 500 provides-substantially the same cooling system as the cold aisle containment system.

Figure 6:
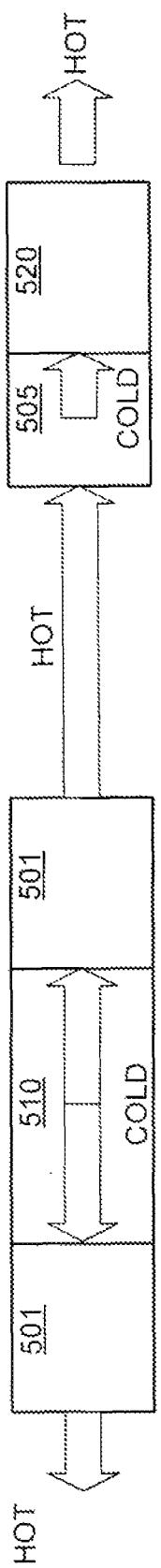
FIG. 6 is a simplified view of the associated airflow for the data center shown in FIG. 5.

The airflow of the exemplary data center in FIG. 5 is illustrated in FIG. 6. Both the rows 501 of racks in the cold aisle containment system and the individual rack 520 located away from the system receive a cold air supply, non-inclusive of the expelled hot air in the data center. Though only one individual rack is shown, the cold pipe may be implemented on multiple racks within a data center, creating a similar airflow to the racks. For example, the cold pipe system 500 may be implemented on each individual rack within the data center, even with the racks 503 arranged in rows in a cold aisle configuration. This airflow creates a more efficient data center, as the cooling system is not forced to overcool the data center environment due to extraneous racks and mixed air within the center. The cold pipe is now described in further detail with reference to an individual system.

Figure 7:
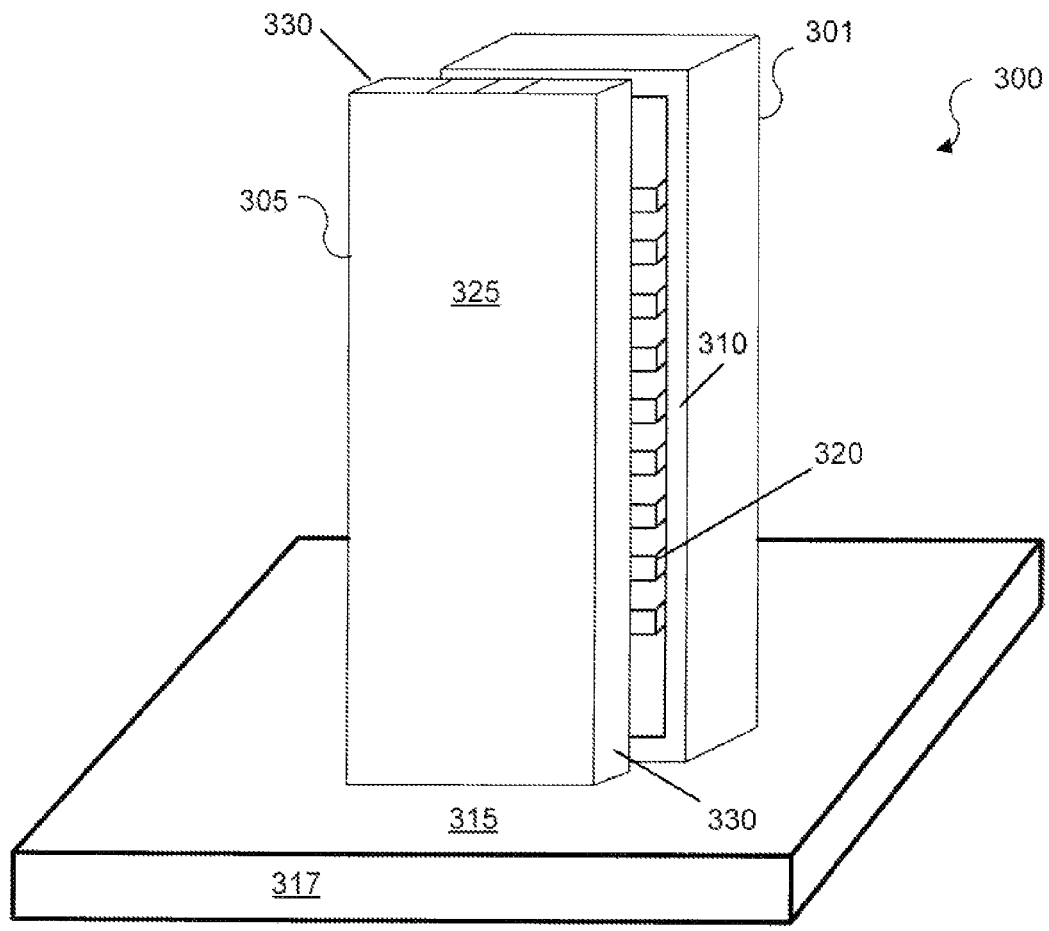
FIG. 7 is an exploded perspective view of a cold pipe system and associated equipment rack.

Referring to FIG. 7, a rack 301 containing rack mounted equipment 320 is shown. The rack may be made of metal, such as aluminum, or any other metal commonly used in the art. The rack may include a perforated front door (not shown) to allow air to flow into the rack and across the mounted equipment 320. Alternatively, the front door may be completely removed, allowing for the rack to accommodate various sizes of rack, mounted equipment 320. In both configurations, the cold pipe 305 is adhered directly to the front of the rack, either to the frame 310 of the rack or to the perforated door. The cold pipe structure may be any structure that can retain air. Though it is called a pipe, in may be rectangular, cylindrical, square or any other shape adequate to accommodate a rack.

The cold pipe 305 may be attached to the rack through use of hook and loop fastener, such as Velcro™, snaps, clamps, bolts or any other form of means which may be utilized to removeably attach the two structures and substantially seal them together reducing the loss of air. The seal may retain enough of the cold air flowing into the cold pipe 305 through the bottom end component 340 to adequately cool the equipment in the rack 301, for example, being able to sustain a pressure of 6 Pascal. Taking into account variable room conditions, such as high raised floor pressure due to cables blocking air movement or low raised floor pressure where no obstructions are found, approximately 95% of the air may be retained inside the cold pipe 305 once the airflow and air pressure in the raised floor are properly tuned. Accordingly, the structure of the cold pipe 305 is designed to be substantially the same height and width of the rack to which it is attached, minimizing the amount of openly exposed rack and release of air. The front component 325 of the cold pipe is similar to the front door of the rack, though it includes no perforations. The front component 325 is coupled, e.g. welded or made out of one piece following a bending process, to the side components 330. Thus, the front component 325 may vary in width in order to accommodate the rack to which it is mounted.

The depth of the Cold pipe is also variable, dependent on the rack to which it is attached, as well as the space available for installation. Thus, the width of the side components 330 is variable. For instance, a larger rack, having a full load of equipment, may necessitate increased airflow within the cold pipe system. The increased airflow may be determined through the amount of raised tile floor which is removed from directly in front of the rack, prior to installation of the cold pipe. Accordingly, the side components of the cold pipe may be manufactured to accommodate this change. The cold pipe may be made of a plastic, non-PVC containing material that is fire retardant. Such a material may include M1 fire-rated plastic.

Cold air is sent through a raised tile floor 315 from a cold air plenum 317 into the cold pipe 305 through an adjustable louver element to fine tune the amount of air that will enter the cold pipe. The cold air contained within the cold pipe 305 is directed vertically across the rack 301 and is drawn through the rack mounted equipment 320. Hot air is then released by the rack without mixing with the cold air entering the rack 301. The cold pipe may be implemented on numerous racks, achieving the same result of decreased cooling capacity and increased available load.

To deliver the cold air into the cold pipe system, a raised floor tile (typically, 60 centimeters "cm" by 60 cm) positioned in front of the rack 301 is cut and removed and a louvered blanking tile is installed prior to installation of the cold pipe. This allows the cold air from the cold air plenum to be delivered to the individual rack. The area of floor removed may be approximately half the size (e.g., 30 by 60 cm) of a standard raised tile (60 cm by 60 cm) within the raised tile floor equipped room. However, as discussed above, removal of an entire tile is also possible if additional pressure is needed to cool the rack 301. In some embodiments, the tile may be completely removed and a louvered tile may be an integrated element of the cold pipe system. Furthermore, the front door of the rack may be removed from its hinges before installing the cold pipe, or, in the case of a rack with a perforated door, the cold pipe may be directly adhered to the front of the rack.

Figure 8:
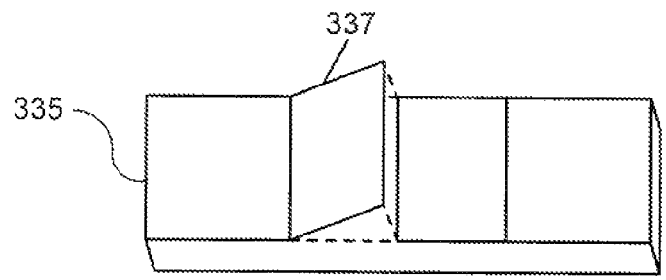
FIG. 8 is a perspective view of an exhaust component of the cold pipe shown in FIG. 7.
Figure 9:
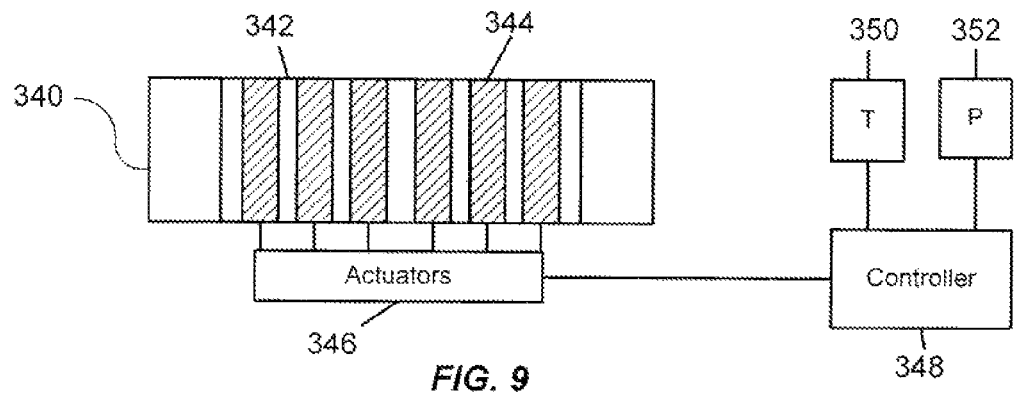
FIG. 9 is a bottom view of the cold pipe shown in FIG. 7.

Referring now to FIGS. 8-9, the cold pipe includes top end component 335 and bottom end component 340, both of which are coupled to the side component 330 and front panel 325 to form a substantially enclosed area in which the cold air supplied by the raised floor is contained. The substantially enclosed area forms a substantially airtight seal between the cold pipe and the rack. The top end component 335 of the cold pipe 305 may include a flap, having two hinged, or otherwise moveable doors capable of opening to release, or expel, additional air. Alternatively, the top end 335 may include a louvered means capable of allowing variable airflow. Accordingly, the top end component 335 may be tunable to allow additional air to be expelled when pressure within the cold pipe is too high. For example, when the pressure within the cold pipe reaches 6 Pascal (Pa) or higher, the flap may automatically release, allowing the air to flow out of the system.

Similarly, the bottom end component 340 may be louvered and tunable to allow variable air flow from the raised tile floor to reach the rack mounted equipment. For example, the louvered bottom end component may be a integrated louvered tile having zero back pressure. In order to control the air flow through the bottom end component, one or more actuators 346 may be attached to the louvers. The actuators 346 may also be coupled to a controller 348, which provides signals to the actuators 346 dependent on the temperature and pressure measured within the cold pipe. Accordingly, one or more temperature sensors 350 and pressure sensors 352 may be located along the length of the front component and/or the side components and may communicate, with the controller 348. In one embodiment, the actuators 346 and controller 348 may comprise a singular unit. In another embodiment, the actuators 346 and controller 348 may comprise two separate units coupled to one another. The bottom end component 340 can measure approximately 30 cm deep from the front of the rack and approximately 60 cm wide, or approximately the same width as the rack on which the cold pipe is implemented.

Figure 10:
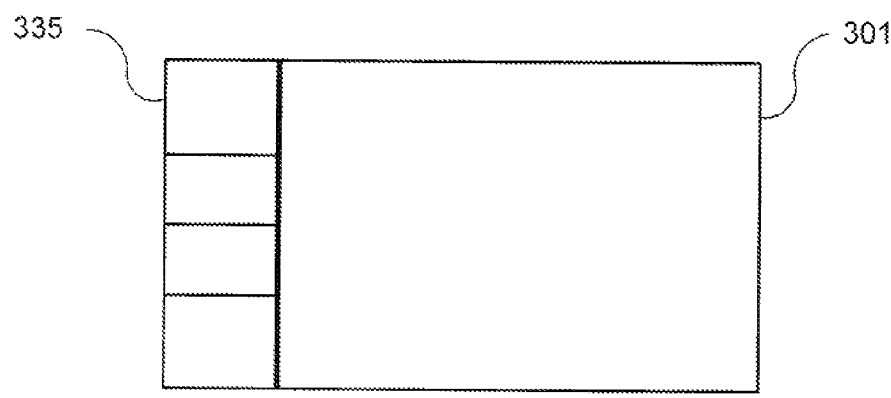
FIG. 10 is a simplified top view of a cold pipe system.

Referring now to FIG. 10, a top view of the cold pipe 301 adhered to a rack 301 is illustrated. The top end component 335, having a releasable flap, may be alternatively located on the floor of the cold pipe system, dependent on the cold air delivery system of the environment in which the rack is located. For example, a cold air delivery system including ducts from the ceiling may require such a configuration.

Figure 11:
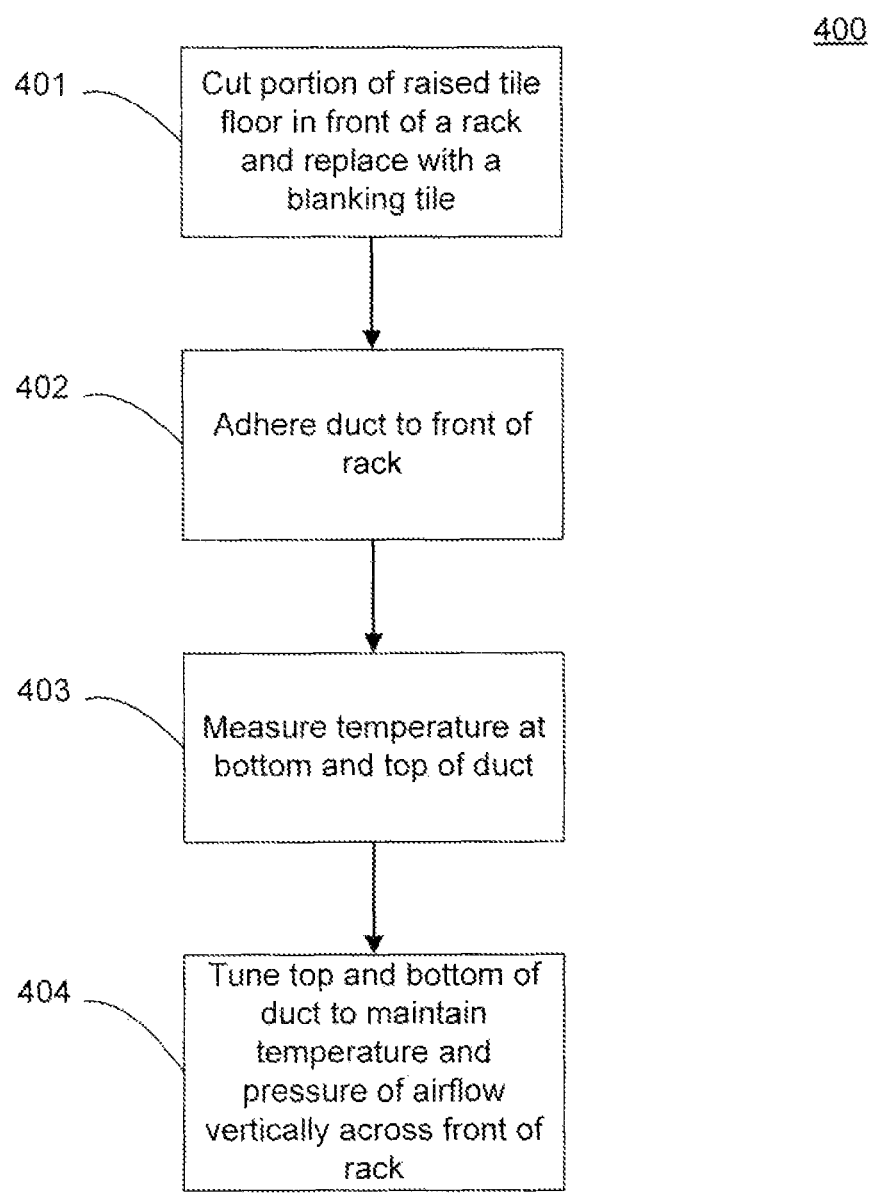
FIG. 11 is a block flow diagram of a process for implementing the cold pipe system.

Referring now to FIG. 11, a flow diagram 400 of implementing the cold pipe is provided with further reference to FIGS. 7-10. The rack mounted equipment 320 contained within the rack 301 on which the cold pipe 305 is installed does not need to be powered off, nor does the rack need to be moved prior to installation. In stage 401, a tile located in front of the rack 301 is removed, cut and replaced with a blanking tile. As previously described, a standard size (60 cm by 60 cm) tile may be cut approximately in half, leaving a 60 cm wide by 30 cm deep tile on a raised tile floor 315, with the blanking tile replacing the remaining 60 cm by 30 cm area. In other embodiments, the tile may be completely removed or Cut in various other sizes, dependent on the size, shape and cooling needs of the rack 301. As described above; if an overhead installation of the rack is necessary, the cold pipe may be retrofitted to accommodate a duct leading from cold air supply system. Additionally, in stage 401, the door of the rack 301 may be removed prior to installation of the cold pipe.

In stage 402, the cold pipe 305 is adhered to the front of the rack 310. An adhesive mechanism, such as Velcro, may be affixed to both the front frame 310 of the rack 301 as well as to the edges of the front and side components of the cold pipe. Alternatively or additionally, snaps, clamps and/or welding may be utilized to affix the cold pipe onto the frame of the rack. The cold pipe 305 structure is not suspended above the ground and may rest on the raised tile floor 315. As previously described, the cold pipe 305 may be made from a plastic material which is non-PVC containing and fire retardant. Because the cold pipe 305 may be made from substantially light materials, the adhesive means does not necessarily need to support a substantial weight, and is utilized primarily to seal the corresponding edges of the cold pipe 305 to the front frame 310 edges of the rack to prevent cold air from, escaping from within the enclosed area.

In stage 403, the temperature is measured at both the top end 335 and bottom end 340 of the rack 305. Preferably, the temperature at the top end is maintained at or below a prescribed temperature for operational use. For instance, some servers utilize an inlet temperature of 22° Celsius (C), while others allow up to 29° C. Having a temperature in close range of the operational temperature helps ensure consistency for cooling the rack mounted equipment through a constant temperature produced by the cooling system. Even slight increases in the temperature and drops in pressure within an environment containing racks may cause the cooling system to work harder to increase cold air output, consequently increasing the total energy usage.

In stage 404, the top end component 335 and bottom end component 340 of the cold pipe 305 are tuned. As described, the bottom end component 340 may be louvered, needing adjustment to control the amount of cold air flow centering the cold pipe 305 from the cold air plenum 317 of the raised tile floor 315. Tuning the airflow entering the cold pipe 305 will allow for increased efficiency of both the cooling system and the rack mounted equipment 320, by allowing ah ideal amount of cold air to reach all levels of the rack mounted equipment 320.

The bottom end component 340 may be manually or automatically tuned, dependent on the system installed in the cold pipe. For instance, pressure and temperature sensors may be installed at top and bottom portion of the cold pipe 305. The sensors may take periodic measurements of within the cold pipe, in order to maintain a constant temperature and pressure, allowing for a more efficient system. The measurements may be sent to a controller 348, which may determine if the bottom end component 340 should allow for increased or decreased air flow. The controller 348 then may send signals through a hard-wired connection, or other communication means, causing the actuators 346 to move the louvers. Accordingly, changes in pressure and/or temperature may trigger the louvered bottom end component 340 to open, allowing increased airflow from the cold air plenum 317 of the raised floor, or to close, allowing for pressure and temperature to rise from heat generated in the rack.

Additionally, the top end component 335 of the cold pipe may be adjusted to allow the flap to open once a specific pressure is reach within the cold pipe. The flap may be controlled by an actuator and controller, or may manually open by the pressure against the resistance of the flap. This offers a failsafe to keep the rack mounted equipment supplied with a consistent amount of cold air.

Other embodiments are within the scope and spirit of the appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Further, more than one invention may be disclosed.

What is claimed is:

1. A system for cooling rack mounted equipment, the system comprising:
   a rack configured to house rack mounted equipment, the rack providing a front port bordered by a top and two sides; and
   a cold-air pipe separable from and attached to the rack about the top and two sides, the cold-air pipe being configured to be in fluid communication with a region adjacent to the cold-air pipe to receive air from the region, the cold-air pipe comprising:
   a front member;
   a plurality of side members coupled to the front member;
   an end member coupled to the plurality of side members and the front member and disposed entirely within the cold-air pipe and at a lowest position of the cold-air pipe, wherein the end member includes louvers and is configured to selectively allow the passage of air through the end member from the region into the cold-air pipe; and
   a connector configured to couple the plurality of side members to the rack;
   wherein the cold-air pipe is attached to the rack to form a substantially airtight seal between the rack and the cold-air pipe.

2. The system of claim 1 wherein the louvers are movable to adjust the amount of airflow within the structure.

3. The system of claim 1 further comprising a top member, coupled to the plurality of side members and the front member, wherein the top member includes a panel configured to move in response to changes in pressure.

4. The system of claim 3 wherein the panel is configured to respond to a pressure inside the cold-air pipe exceeding a threshold by opening to allow air to pass through the top member.

5. The system of claim 1 wherein the plurality of side members are attached to the rack by hook and loop fasteners.

6. The system of claim 1 further comprising a temperature sensor and a controller communicatively coupled with the temperature sensor and the end member and configured to control the end member in accordance with a temperature indicated by the temperature sensor to regulate air flow through the end member.

7. The system of claim 1 wherein the plurality of side members each have a width about one half a width of the front member.

8. The system of claim 1 further comprising a cold air delivery mechanism configured to deliver cold air via the region to the cold-air pipe.

9. A duct for a rack having rack mounted equipment, the duct comprising:
   a front member;
   a plurality of side members, wherein the two or more side members are coupled to the front member to form therewith a cold pipe configured to be attached to the front of the rack and retain air between the side members, the front member and the front of the rack when attached to the rack;
   an end member coupled to the plurality of side members and the front member and disposed entirely within the cold pipe and at a lowest position of the cold pipe, wherein the end member includes louvers and is configured to selectively allow the passage of air through the end member;

a connector configured to couple the plurality of side members to the rack; and one or more actuators coupled to the end member and responsive to signals received from a controller, the signals causing the one or more actuators to adjust the louvers of the end member;

wherein the cold pipe is separable from and attachable to the rack about the top and plurality of side members to form a substantially airtight seal between the rack and the cold pipe; and wherein the cold pipe is configured to be in fluid communication with a region adjacent to the rack and to receive air from the region.

10. The duct of claim 9, wherein the end member is 30 centimeters in depth.

11. The duct of claim 9, wherein the end member is 60 centimeters in width.

12. The duct of claim 9, wherein the one or more actuators and controller comprise a single unit.

13. The duct of claim 9, wherein the plurality of side members are attached to the rack by hook and loop fasteners.

14. The duct of claim 9 further comprising a top member, coupled to the plurality of side members and the front member, wherein the top member includes a panel configured to move in response to changes in pressure.

15. The duct of claim 14, wherein the panel is configured to respond to a pressure inside the cold pipe exceeding a threshold by opening to allow air to pass through the top member.

16. The duct of claim 9, further comprising each of one or more temperature sensors and one or more pressure sensors, wherein the sensors are communicatively coupled to the controller.

17. The duct of claim 16, wherein the temperature and pressure indicated by the sensors determine the amount of adjustment by the one or more actuators.

18. A method for cooling rack mounted equipment, the method comprising:

attaching a duct, using a connector of the duct, onto a front of a rack configured to house the rack mounted equipment, the duct comprising:

a front member;

a plurality of side members coupled to the front member to form therewith a cold pipe configured to be removably attached to the front of the rack and retain air between the side members, the front member and the front of the rack when attached to the rack; and an end member coupled to the plurality of side members and the front member and disposed entirely within the cold pipe at a lowest position of the cold pipe, wherein the end member includes louvers and is configured to selectively allow the passage of air through the end member;

supplying cold air into the cold pipe, wherein the air is supplied vertically across the front of the rack through the cold pipe;

substantially containing the cold air within an area between the front of the rack and the cold pipe;

measuring the temperature and the pressure within the contained area; and adjusting airflow into the contained area of the rack dependent on the measured temperature and pressure within the contained area.

* * * * *